US008547391B2

(12) United States Patent
Maxik et al.

(10) Patent No.: US 8,547,391 B2
(45) Date of Patent: Oct. 1, 2013

(54) HIGH EFFICACY LIGHTING SIGNAL CONVERTER AND ASSOCIATED METHODS

(75) Inventors: Fredric S. Maxik, Indialantic, FL (US); Robert R. Soler, Cocoa Beach, FL (US); David E. Bartine, Cocoa, FL (US); Ran Zhou, Cape Canaveral, FL (US); Valerie A. Bastien, Melbourne, FL (US); Matthew Regan, Melbourne, FL (US); Eliza Katar Grove, Satellite Beach, FL (US); Eric Bretschneider, Scottsville, KY (US)

(73) Assignee: Lighting Science Group Corporation, Satellite Beach, FL (US)

( * ) Notice: Subject to any disclaimer, the term of this patent is extended or adjusted under 35 U.S.C. 154(b) by 94 days.

(21) Appl. No.: 13/107,928

(22) Filed: May 15, 2011

(65) Prior Publication Data

US 2012/0286700 A1 Nov. 15, 2012

(51) Int. Cl.

| | |
|---|---|
| ***G09G 5/00*** | (2006.01) |
| ***G09G 5/02*** | (2006.01) |
| ***G09G 3/14*** | (2006.01) |
| ***G09G 3/34*** | (2006.01) |
| ***G09G 5/10*** | (2006.01) |
| ***H04N 9/04*** | (2006.01) |
| ***H04N 5/46*** | (2006.01) |
| ***H04N 5/00*** | (2011.01) |
| ***H04N 5/70*** | (2006.01) |
| ***G06K 9/00*** | (2006.01) |
| ***G06K 9/40*** | (2006.01) |
| ***G03F 3/08*** | (2006.01) |

(52) U.S. Cl.

USPC ............... 345/590; 345/46; 345/84; 345/591; 345/600; 345/690; 348/279; 348/557; 348/612; 348/801; 358/518; 382/167; 382/274

(58) Field of Classification Search

USPC ................. 345/36, 39, 44, 46, 48, 76–77, 84, 345/204, 207, 426–428, 581, 589–591, 600–601, 345/604, 606, 690; 348/68, 70–71, 253–254, 348/268–271, 277–279, 552, 557, 560, 602, 348/612, 630, 687, 750, 801–803; 358/509–510, 512, 518–519, 523; 382/162, 382/167, 254, 274, 276

See application file for complete search history.

(56) References Cited

U.S. PATENT DOCUMENTS

| | | | | |
|---|---|---|---|---|
| 5,523,878 A | | 6/1996 | Wallace et al. | |
| 5,680,230 A | * | 10/1997 | Kaburagi et al. | 358/520 |

(Continued)

FOREIGN PATENT DOCUMENTS

| | | | |
|---|---|---|---|
| CN | 101 702 421 | A | 5/2010 |
| WO | WO2009/121539 | A1 | 10/2009 |
| WO | WO 2012/158665 | | 11/2012 |

*Primary Examiner* — Wesner Sajous

(74) *Attorney, Agent, or Firm* — Mark R. Malek; Keith Olinga Mitchell; Zies Widerman & Malek

(57) ABSTRACT

A signal adapting chromacity system to control that may include a signal conversion engine to receive a source signal designating a color of light defined by a two spatial plus luminance dimensional color space, such as the xxY color space. The signal conversion engine may convert the source signal to a three dimensional color space defined within a subset gamut of a full color gamut, such as an RGW, RBW, or GBW color space. The subset gamut may include a first color light, a second color light and a high efficacy light. The signal conversion engine may perform a conversion operation to convert the source signal to an output signal, using the output signal to drive light emitting diodes (LEDs). The conversion operation may be a matrix, angular or linear conversion operation.

30 Claims, 11 Drawing Sheets

(56) References Cited

U.S. PATENT DOCUMENTS 5,704,701 A 1/1998 Kavanagh et al.
5,997,150 A 12/1999 Anderson
6,140,646 A 10/2000 Busta et al.
6,341,876 B1 1/2002 Moss et al.
6,356,700 B1 3/2002 Strobl
6,594,090 B2 7/2003 Kruschwitz et al.
6,767,111 B1 7/2004 Lai
6,817,735 B2 11/2004 Shimizu et al.
6,870,523 B1 3/2005 Ben-David et al.
6,871,982 B2 3/2005 Holman et al.
6,974,713 B2 12/2005 Patel et al.
7,072,096 B2 7/2006 Holman et al.
7,075,707 B1 7/2006 Rapaport et al.
7,083,304 B2 8/2006 Rhoads et al.
7,178,941 B2 2/2007 Roberge et al.
7,246,923 B2 7/2007 Conner
7,261,453 B2 8/2007 Morejon et al.
7,289,090 B2 10/2007 Morgan
7,300,177 B2 11/2007 Conner
7,303,291 B2 12/2007 Ikeda et al.
7,342,658 B2 3/2008 Kowarz et al.
7,349,095 B2 3/2008 Kurosaki
7,400,439 B2 7/2008 Holman
7,429,983 B2 9/2008 Islam
7,434,946 B2 10/2008 Huibers
7,438,443 B2 10/2008 Tatsuno et al.
7,476,016 B2 1/2009 Kurihara
7,507,001 B2 * 3/2009 Kit ................................ 362/276
7,520,642 B2 4/2009 Holman et al.
7,530,708 B2 5/2009 Park
7,540,616 B2 6/2009 Conner
7,598,686 B2 10/2009 Lys et al.
7,626,755 B2 12/2009 Furuya et al.
7,677,736 B2 3/2010 Kasazumi et al.
7,684,007 B2 3/2010 Hull et al.
7,703,943 B2 4/2010 Li et al.
7,705,810 B2 4/2010 Choi et al.
7,709,811 B2 5/2010 Conner
7,719,766 B2 5/2010 Grasser et al.
7,728,846 B2 6/2010 Higgins et al.
7,766,490 B2 8/2010 Harbers et al.
7,828,453 B2 11/2010 Tran et al.
7,832,878 B2 11/2010 Brukilacchio et al.
7,834,867 B2 11/2010 Sprague et al.
7,845,823 B2 12/2010 Mueller et al.
2003/0039036 A1 2/2003 Kruschwitz et al.
2004/0052076 A1 3/2004 Mueller et al.
2004/0218390 A1 11/2004 Holman et al.
2005/0031199 A1 * 2/2005 Ben-Chorin et al. ......... 382/162
2005/0083352 A1 * 4/2005 Higgins ........................ 345/690
2005/0128751 A1 * 6/2005 Roberge et al. ............... 362/276
2005/0174768 A1 8/2005 Conner
2006/0002101 A1 1/2006 Wheatley et al.
2006/0002108 A1 1/2006 Ouderkirk et al.
2006/0002110 A1 * 1/2006 Dowling et al. .............. 362/252
2006/0164005 A1 7/2006 Sun
2006/0164607 A1 7/2006 Morejon et al.
2006/0285193 A1 12/2006 Kimura et al.
2007/0013871 A1 1/2007 Marshall et al.
2007/0131954 A1 * 6/2007 Murayama et al. ............. 257/98
2007/0159492 A1 7/2007 Lo et al.
2007/0211449 A1 9/2007 Holman et al.
2008/0143973 A1 6/2008 Wu
2008/0198572 A1 8/2008 Medendorp
2008/0232084 A1 9/2008 Kon
2009/0046307 A1 2/2009 Kwak et al.
2009/0059585 A1 3/2009 Chen et al.
2009/0128781 A1 5/2009 Li
2009/0262516 A1 10/2009 Li
2009/0273918 A1 11/2009 Falicoff et al.
2010/0006762 A1 1/2010 Yoshida et al.
2010/0046234 A1 2/2010 Abu-Ageel
2010/0061068 A1 3/2010 Geissler et al.
2010/0061078 A1 3/2010 Kim
2010/0091034 A1 * 4/2010 Matsumoto et al. .......... 345/601
2010/0110516 A1 5/2010 Penn et al.
2010/0165599 A1 7/2010 Allen
2010/0202129 A1 8/2010 Abu-Ageel
2010/0231863 A1 9/2010 Hikmet et al.
2010/0244700 A1 9/2010 Chong et al.
2010/0315320 A1 12/2010 Yoshida
2010/0320928 A1 12/2010 Kaihotsu et al.
2010/0321641 A1 12/2010 Van Der Lubbe
2011/0037390 A1 * 2/2011 Ko et al. ....................... 315/117
2011/0310446 A1 * 12/2011 Komatsu ....................... 358/518

* cited by examiner

HIGH EFFICACY LIGHTING SIGNAL CONVERTER AND ASSOCIATED METHODS

FIELD OF THE INVENTION

The present invention relates to the field of lighting devices and, more specifically, to converting a non-optimized lighting source signal to utilize a high efficacy light emitting semiconductor.

BACKGROUND OF THE INVENTION

Some lighting devices are generally capable of emitting light within virtually any color range. This diversity of color emitted may be accomplished via a combination of various colored primary light sources emitting light at varying luminosities. Commonly, in devices that combine light to create various colors, the primary light sources include red, blue, and green colored light.

Red, green, and blue are traditionally known as primary additive colors, or primaries. Additional colors may be created though the combination of the primaries. By combining two additive colors in substantially equal quantities, the secondary colors of cyan, magenta, and yellow may be created. Combing all three primary colors may produce white. By varying the luminosity of each color emitted, approximately the full color gamut may be produced.

In systems using three primary colors to control the luminosity of the emitted light, the brightness of the emitted colored light may be controlled by altering the brightness of the primaries corresponding to the output color desired. If a white output color is desired, all primaries would be required to emit light at full luminosity. In a lighting system that utilizes LEDs to emit light, operating every LED at full luminosity may require using an undesirably large amount of energy and may produce and excessive amount of heat. Therefore, there exists a need for an efficient system to emit light of virtually any color included within the full color gamut without the inefficient operation characteristics of the prior art.

In attempts to satisfy this need for the efficient emission of colored light, inventions in the prior art have disclosed adding a white light source to supplement the primary color light sources. By including an additional white light source, the white light may provide additional brightness without requiring the primary light sources to operate at full luminosity. However, most lighting source signals do not contemplate the inclusion of a white light source, resulting in signals that cannot drive the white light source of the modified lighting device.

Previous disclosures have described methods of estimating a white input signal from an RGB (red-green-blue) input signal by using various methods. U.S. Patent Application Publication 2007/0157492 to Lo et al. discloses approximating a white value by comparing grayscale values of the primaries. However, the approximation disclosed in the Lo et al. '492 publication requires discarding luminosity values, resulting in potentially inaccurate results.

U.S. Pat. No. 7,728,846 to Higgins et al. discloses converting an RGB signal to an RGBW (red-green-blue-white) through complex matrices and algorithms. However, the Higgins et al. '846 patent outputs a signal that drives a white light source in addition to the primaries, requiring the operation of a large number of power consuming elements than before conversion of the signal may occur.

The proposed solutions included in the prior art that create a signal to drive a white light source commonly drive the white light source in addition to the preexisting primaries. By adding a new lighting source, the proposed solutions of the prior art may not operate with optimal efficiency characteristics. Additionally, the solutions proposed in the prior art contemplate converting an RGB into an RGBW signal. As a result, any additional input signal formats, such as the commonly used xyY color space, must first undergo conversion operations which may be computationally intensive and wasteful of energy. Furthermore, the disclosures in the prior art require the use of light sources defined within the full color gamut to reproduce light in various colors, contributing to inefficient operation of the devices included in the prior art.

There exists a need for a lighting signal converter that may accept a source signal capable of defining a colored light in a two spatial plus luminance dimensional color space that includes the full color gamut, such as the xyY color space, and produce an output signal that is defined in a three dimensional color space defined by a subset gamut of the full color gamut. There further exists a need for a lighting signal converter that outputs a signal to efficiently drive a minimal number of primary light sources along with a high efficacy light source.

SUMMARY OF THE INVENTION

With the foregoing in mind, it is therefore an object of the present invention to provide a lighting signal converter that may advantageously accept a source signal that defines a colored light in a two spatial plus luminance dimensional color space which includes the full color gamut. More specifically, the present invention may advantageously accept a source input defined by the xyY color space. The present invention may also advantageously produce an output signal that is defined in the three dimensional color space defined by a subset gamut of the full color gamut. The present invention may further output a signal to efficiently drive a minimal number of primary light sources along with a high efficacy light source, advantageously reducing power consumption and heat generation.

These and other objects, features, and advantages according to the presenting invention are provided by a lighting device for directing source light within a predetermined source wavelength range in a desired output direction that may include a high efficacy lighting signal converter. The high efficacy lighting signal converter may include a signal adapting chromacity system to control a lighting device. The system may further include a signal conversion engine that receives a source signal designating a color of light defined by a two spatial plus luminance dimensional color space and converts the source signal to a three dimensional color space defined within a subset gamut of a full color gamut. The subset gamut may include a first color light, a second color light and a high efficacy light.

The signal conversion engine may perform a conversion operation to convert the source signal to an output signal, and uses the output signal to drive light emitting diodes (LEDs). The first color light and the second color light are emitted by colored LEDs, and wherein the high efficacy light is emitted by a high efficacy LED. A conversion coating may be applied to the colored LEDs to convert a source light wavelength range into a converted light wavelength range.

The two spatial plus luminance dimensional color space may be a xyY color space. Additionally, the three dimensional color space defined within the full color gamut may be a RGBW color space. The three dimensional color space defined within the subset gamut may be one of a RGW color space, GBW color space, or RBW color space.

The first color light and the second color light are selected from a group comprising a red light, a blue light, and a green light, and wherein the high efficacy light is a white light. The high efficacy light is defined by a color temperature between 2000K and 10000K.

The conversion operation may convert the source signal to the output signal by performing a matrix conversion operation. In the matrix conversion operation, the matrices may be defined for the two spatial plus luminance dimensional color space included in the source signal. The matrices may then be inverted to define inverse matrices that are processed to define a scalar including scalar values that are positive and included in the output signal. The output signal may define the color of the light in the three dimensional color space defined within the subset gamut.

A method aspect of the present invention is for a conversion operation. The conversion operation may convert the source signal to the output signal by performing a matrix conversion operation. In the matrix conversion operation, the matrices may be defined for the two spatial plus luminance dimensional color space included in the source signal. The matrices may then be inverted to define inverse matrices that are processed to define a scalar including scalar values that are positive and included in the output signal. The output signal may define the color of the light in the three dimensional color space defined within the subset gamut. The matrices that are defined as non-square matrices may undergo square matrix preconditioning.

The conversion operation may convert the source signal to the output signal by performing an angular conversion operation. In the angular conversion operation, the three dimensional color space defined by the subset gamut is divided from the full color gamut by using angular determination. The subset gamut may include an origin that includes the high efficacy light and primaries that include colored light. The primaries may be defined in the subset gamut including a first subset primary relative to the first color light and a second subset primary relative to the second color light. A subset gamut angular range may be included between a first primary angle relative to the first subset primary and a second primary angle relative to the second primary angle.

The three dimensional color space included in the subset gamut may be triangularly located between the origin, the first subset primary, and the second subset primary. The color of the light defined by the two spatial plus luminance dimensional color space may be plotted in the three dimensional color space of the full color gamut. Additionally, the three dimensional color space defined by the subset gamut relative to the color of the light, the color angle being located between the first primary angle and the second primary angle.

A first primary angular range may be included between the first primary angle and the color angle. Similarly, a second primary angular range is included between the second primary angle and the color angle. The first primary angular range may be compared to the second primary angular range to determine a first primary angular ratio proportional to a first portion of the subset gamut angular range comprised of the first primary angular range. The first primary angular ratio may determine a luminosity of the first subset primary included in the output signal.

Similarly, the second primary angular range may be compared to the first primary angular range to determine a second primary angular ratio proportional to a second portion of the subset gamut angular range comprised of the second primary angular range. The second primary angular ratio may determine the luminosity of the second subset primary included in the output signal. The first subset primary and second subset primary may be analyzed to determine the luminosity of the high efficacy light included in the output signal.

The conversion operation may convert the source signal to the output signal by performing a linear conversion operation. In the linear conversion, the three dimensional color space defined by the subset gamut is divided from the full color gamut to include an origin that includes the high efficacy light and primaries that include colored light. The primaries may be defined in the subset gamuts including a first subset primary relative to the first color light and a second subset primary relative to the second color light. A color point may be defined by plotting the color of the light as defined within the two spatial plus luminance dimensional color space in the three dimensional color space of the full color gamut.

Lines may be defined relative to the two spatial plus luminance dimensional color space. The lines may include a first primary line defined between the origin and the first subset primary and a second primary line defined between the origin and the second subset primary. The lines may also include a color line defined between origin and the color point including a slope and an axial intercept, and a subset gamut line that intersects the first primary line, the second primary line, and the color point.

The axial intercept may be located at the origin. The subset gamut line may interest the first primary line at a first primary intersection distance from the origin The subset gamut line may intersect the second primary line at a second primary intersection distance from the origin. The first primary intersection distance and the second primary intersection distance may be substantially equal.

A subset gamut linear range may be defined along the subset gamut line between the first primary line and the second primary line. The subset gamut linear range may include a first primary linear range and a second primary linear range. The first primary linear range may be compared to the second primary linear range to determine a first primary linear ratio proportional to a first portion of the subset gamut linear range. The first portion of the subset gamut linear range may be comprised of the first primary linear range, and the first primary linear ratio determining a luminosity of the first subset primary included in the output signal.

The second primary linear range may be compared to the first primary linear range to determine a second primary linear ratio proportional to a second portion of the subset gamut linear range comprised of the second primary linear range, and the second primary linear ratio determining the luminosity of the second subset primary included in the output signal. The luminosity of the first subset primary and the second subset primary may be analyzed to determine the desired luminosity of the high efficacy light included in the output signal.

DETAILED DESCRIPTION OF THE PREFERRED EMBODIMENT

Figure 1:
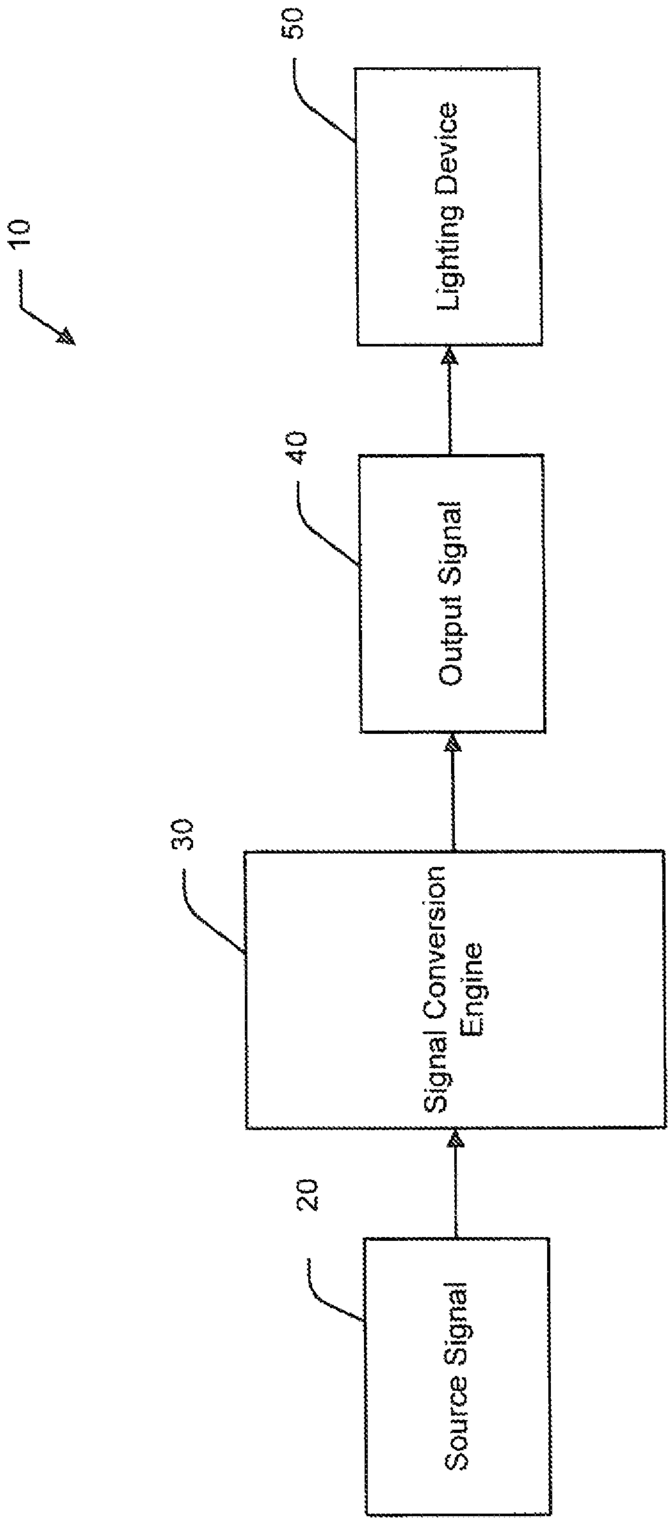
FIG. 1 is a block diagram of the signal converter of the present invention.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Those of ordinary skill in the art realize that the following descriptions of the embodiments of the present invention are illustrative and are not intended to be limiting in any way. Other embodiments of the present invention will readily suggest themselves to such skilled persons having the benefit of this disclosure. Like numbers refer to like elements throughout.

In this detailed description of the present invention, a person skilled in the art should note that directional terms, such as "above," "below," "upper," "lower," and other like terms are used for the convenience of the reader in reference to the drawings. Also, a person skilled in the art should notice this description may contain other terminology to convey position, orientation, and direction without departing from the principles of the present invention.

A person of skill in the art will appreciate that, while the following disclosure may discuss the lighting signal converter 10 of the present invention as converting a source signal 20, which may be defined in the xyY color space, into an output signal 40 that may be defined in one of a RGW, RBW, or GBW color space, additional conversions are intended to be include within the scope and spirit of the present invention. A skilled artisan will also appreciate conversion operations, which may involve converting a source signal 20 into an output signal 40 to drive light emitting devices 50. A skilled artisan will further appreciate that the output signal 40 may include a color space, defined within a subset gamut 102 of a full color gamut 100, to be included as part of the present invention.

Referring now to FIGS. 1-10, a signal converter 10 according to the present invention in now described in greater detail. Throughout this disclosure, the signal converter 10 may also be referred to as a system or the invention. Alternate references of the signal converter 10 in this disclosure are not meant to be limiting in any way.

In the following disclosure, referring initially to FIG. 8, a subset gamut 102 may be described to include the RBW subset gamut 102RB, the RGW subset gamut, 102RG, and the GBW subset gamut 102GB. A person of skill in the art will appreciate that the term subset gamut 102 may include one or more specific subset gamuts, such as, for example, subset gamuts 102RB, 102RG, or 102GB.

Referring back to FIG. 1, the signal converter 10 according to an embodiment of the present invention may include a signal conversion engine 30 that illustratively receives a source signal 20. The signal conversion engine 30 may perform a conversion operation to the source signal 20. The conversion operation may generate an output signal 40 that may be used to drive a lighting device 50, such as a LED lighting device. More specifically, the signal conversion engine 30 may convert a source signal 20 from a two spatial plus luminance dimensional color space into a three dimensional color space. An example of a two spatial plus luminance dimensional color space may be provided by the xyY color space. Examples of a three dimensional color space may be provided by the RGW, RBW, and GBW color spaces that are defined within a subset gamut 102RG, 102RB, 102GB of the full color gamut 100. The subset gamut 102 may be defined to include the color space enclosed by two primary sources 52 and 54 and a high efficacy source 58 (see additionally FIGS. 2 and 4-8).

Figure 2:
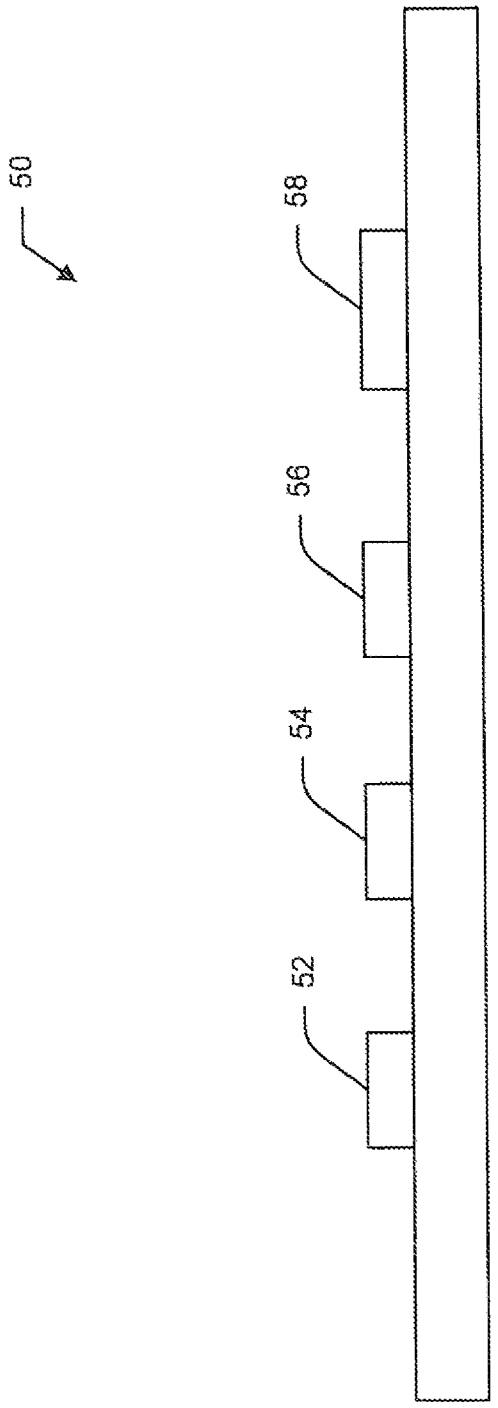
FIG. 2 is a side elevation of a lighting device operated by the output signal generated by the signal converter of the present invention.

As perhaps best illustrated in FIG. 2, an illustrative LED lighting device 50 may include three primary light sources 52, 54, 56 and a high efficacy light source 58. The primary light sources 52, 54, 56 may emit light in the primary colors. More specifically, the primary colors may be emitted by, for example and without limitation, a red LED, a blue LED, and a green LED. The high efficacy light source 58 may emit a light defined to emulate the color of light that may be emitted from each primary color with approximately equal luminosity. The light emitted from the high efficacy light 58 may further be defined by color temperature between 2000K and 10000K, or approximately the color temperate range of daylight. More specifically, the high efficacy light 58 may be a white light, for example, a mint white light.

Figure 3:
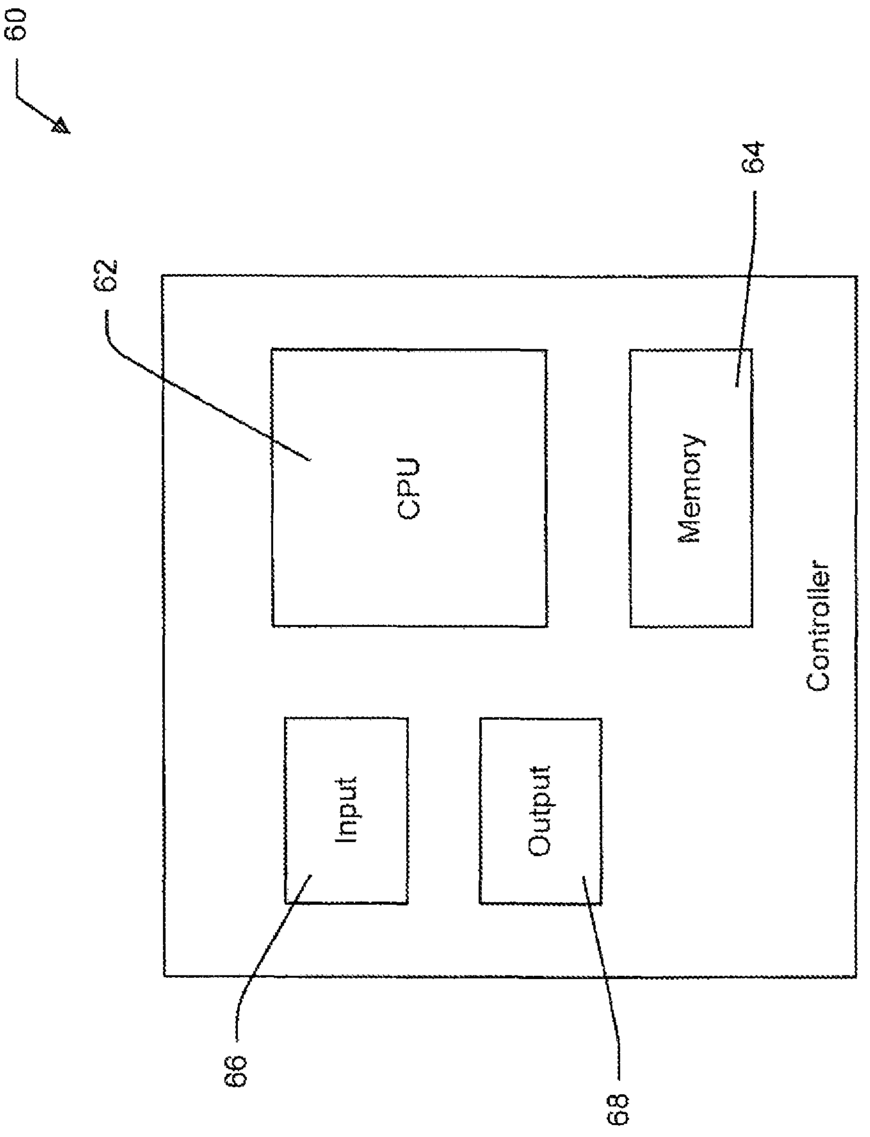
FIG. 3 is a block diagram of a controller of the signal converter according to the present invention that may perform a signal conversion operation.

As perhaps best illustrated in FIG. 3, a controller 60 may be provided to convert the source signal 20 into the output signal 40. The controller 60 may include a central processing unit (CPU) 62, which may accept and execute computerized instructions. The controller 60 may also include a memory 64, which may store data and instructions used by the CPU 62. Additionally, the controller 60 may include an input 66 to receive a source signal 20 and an output 68 to transmit an output signal 40. The signal conversion engine 30 may be operated on the controller 60, and the signal conversion operation is discussed in greater detail below.

Referring again back to FIG. 1, the color spaces of the source signal 20 and the output signal 40 will now be discussed. Preferably, the source signal 20 received by the signal conversion engine 30 is formatted in the CIE 1931 xyY color space. The xyY color space is a color space derived from the CIE 1931 XYZ color space, and the two CIE 1931 color spaces may easily be calculated from one another. As a result, the xyY color space is commonly used within the art to specify colors.

In the xyY space, the "x" and "y" values may define the chromaticity of the color to be emitted by a lighting source 50 via the relative location of a corresponding point plotted on a CIE 1931 chromaticity diagram. The "Y" value may define the brightness of the color to be emitted by the lighting source 50 for the corresponding color point defined by the "x" and "y" value.

By combining the color as defined by the chromaticity values with the corresponding luminosity defined by the brightness values, virtually any color may be defined within the xyY color space. Additionally, since the xyY color space may include a brightness value, calculating the luminance of the high efficacy lighting source 58 may advantageously be simplified.

As previously mentioned, the xyY color space is derived from the XYZ color space. The "x" and "y" components may represent may the chromasity of the emitted color, which may correlate with the three colors sensed by the "cone" photoreceptors in the human eye. This correlation may contribute to enhanced color reproduction accuracy. Also, since the "Y" brightness value of the xyY color space defines the brightness of the corresponding colored light, the xyY color space may accurately convey the brightness as perceived by the "rod" photoreceptors in the human eye. For this reason, the CIE 1931 xyY color space, and the related XYZ color space, may advantageously provide accurate color reproduction, while allowing a simplified conversion between other color spaces, such as the RGB (red-green-blue) three dimensional color space.

The output signal 40 may define the colored light in a three dimensional color space, such as a color space included within a subset gamut 102 of the full color gamut 100. The term gamut may be defined by the dictionary as an entire range or series, and when the term is applied to color, gamut may define a complete range of colors that may be accurately produced within a color space. Correspondingly, a full color gamut 100 is intended to include all colors that may be produced within a given color space.

Additionally, as used within this disclosure, the full color gamut 100 may be segmented into one or more subset gamuts 102. The following disclosure may describe subset gamuts 102 as separate from one another and collectively forming a full color gamut 100. However, a person of skill in the art will appreciate embodiments wherein multiple subset gamuts 102 may define the same color range within the color space, in an overlapping fashion, to be included within the scope of the present invention.

Figure 4:
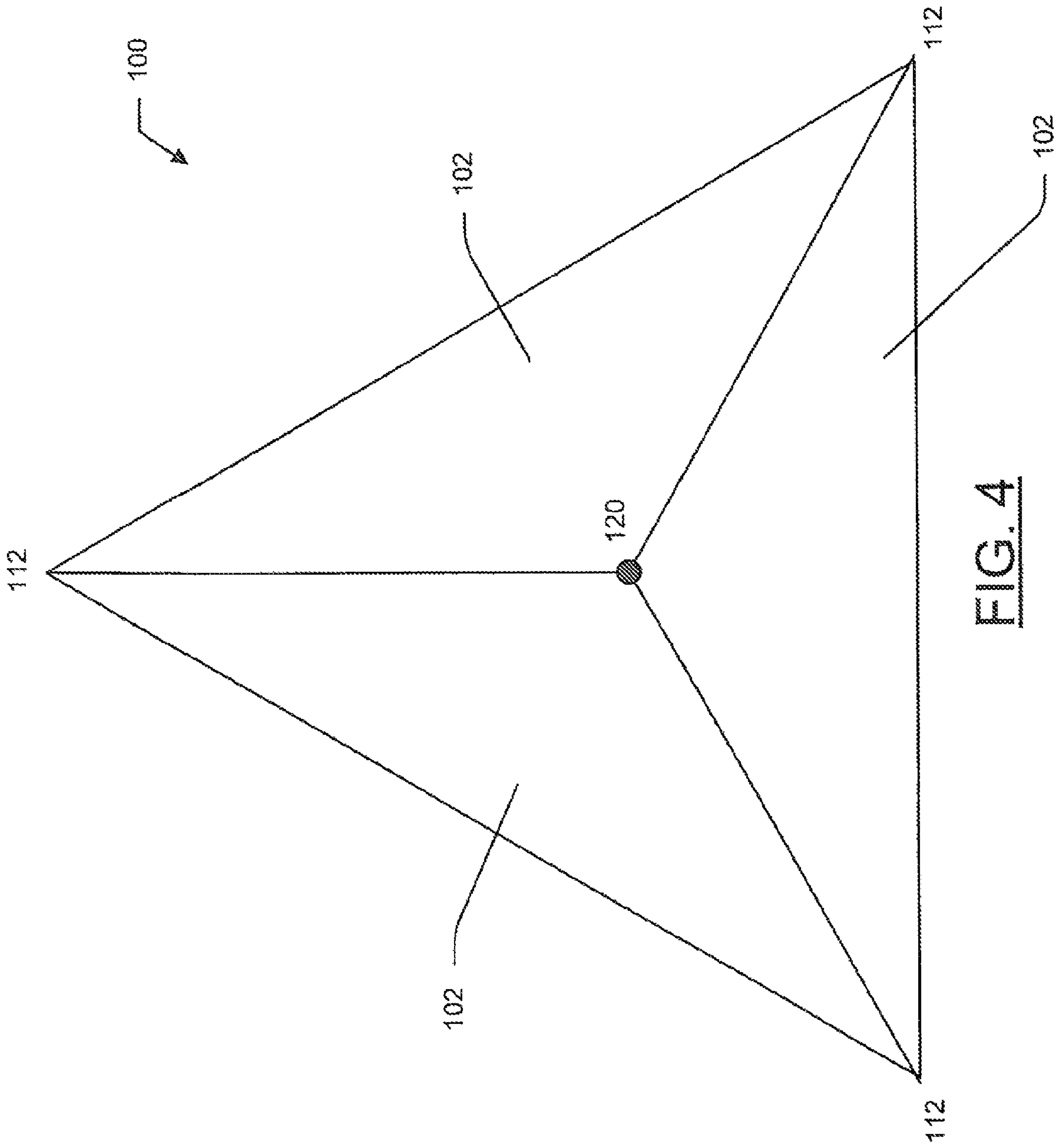
FIG. 4 is a diagram of the full color gamut including subset gamuts.

As illustrated in FIG. 4, the following example is provided as an illustrative embodiment describing a configuration of a color space defined within a full color gamut 100 segmented into subset gamuts 102. For clarity, the color space within the full color gamut 100 is depicted as an equilateral triangle. A primary 112 may be located at each point of the triangle that represents the full color gamut 100. For clarity, but not intended as a limitation, the primaries 112 have been depicted as the primary additive colors, red 112R, green 112G, and blue 112B, as illustrated, for example, in FIG. 8.

Continuing to refer to the equilateral triangle representing the full color gamut 100, a range of colors that may be produced by mixing the primaries can be located within the triangle. For example, the secondary color of cyan, which may include an equal amount of light produced by two primaries 112, may be represented at the midpoint of the triangle's side, between the blue primary and the green primary. Additional colors that may include light from three primaries may be represented at locations within the interior of the triangle.

An origin 120 may be located approximately at the center of the triangle representing the full color gamut 100. The origin 120 may indicate the location wherein the corresponding light includes an equal amount of colored light emitted from each of the primaries 112, combining to produce a white light. As will be described below, a high efficacy light 138, such as a white light, may be defined at approximately the origin 120 of the triangular model of the full color gamut 100.

The full color gamut 100 may be segmented into subset gamuts 102. Continuing the equilateral triangle model discussed above, for clarity, the full color gamut 100 may be segmented into three equal subset gamuts 102. Each subset gamut 102 may include and be defined by the origin 120 and two primaries 112. The two primaries used to define one of the subset gamuts may be defined as a first subset primary and a second subset primary. For example, and with reference to FIG. 8, a subset gamut 102RB may include the red primary 112R, the blue primary 112B, and the origin 120W. In the present example, the full color gamut 100 may be represented in its substantial entirety through the combination of the subset gamuts 102.

Figure 5:
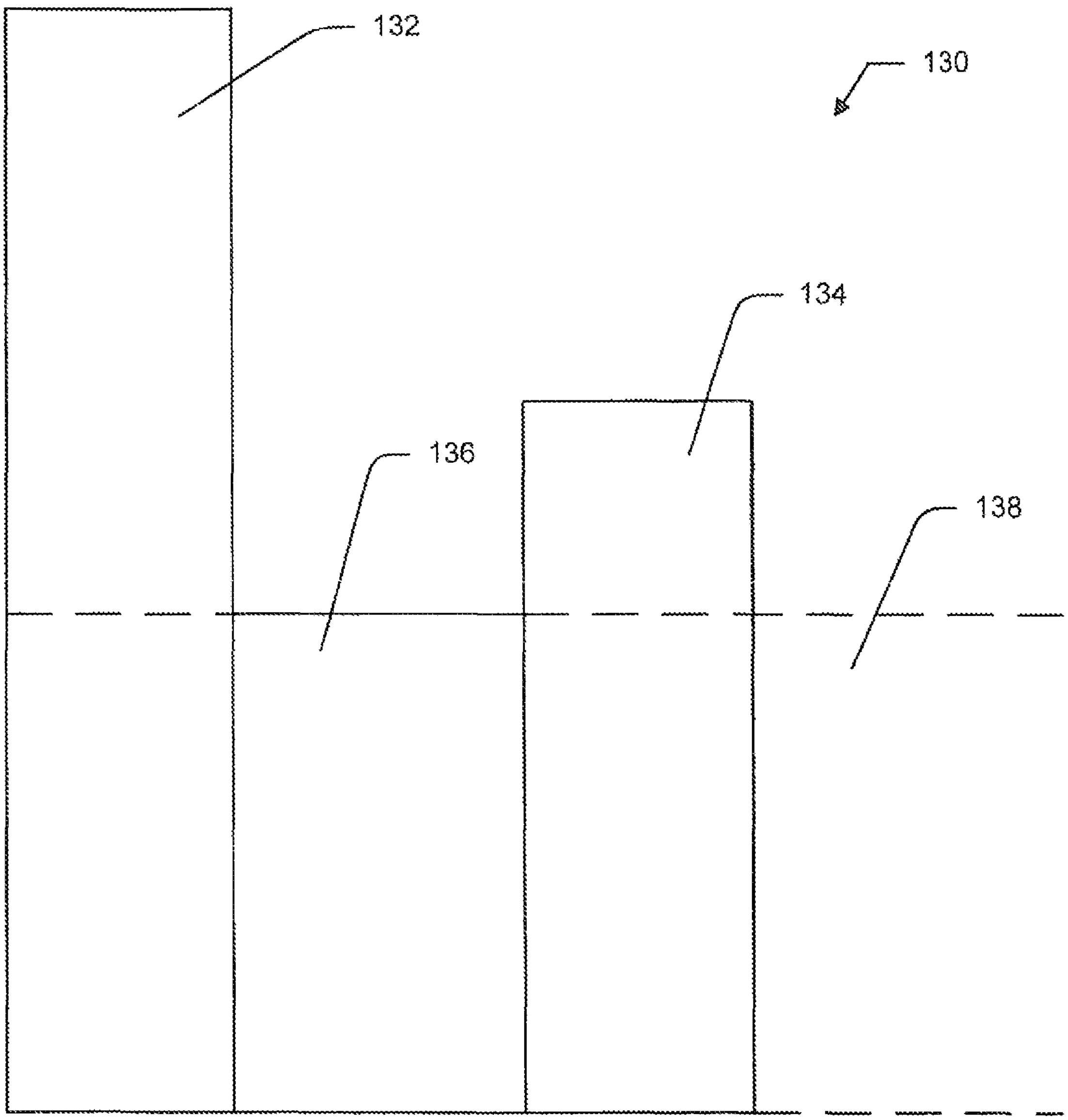
FIG. 5 is a diagram illustrating an example of the luminosity of light emitted by primary light sources during operation of the signal converter of the present invention.

Referring now to FIG. 5, the use of a high efficacy light 138 to replace the need for a third primary light 138 will now be discussed. The diagram included in FIG. 5 is provided for illustrative purposes only, as a person of skill in the art will appreciate a plethora of additional colors that may be produced by a lighting device 50. These additional colors may be driven by the output signal 40, which may be generated by the signal converter 10 of the present invention.

A high efficacy light 138 may be created from the light provided by the three primaries 132, 134, 136 emitting light of substantially equivalent luminosity. Correspondingly, light that would otherwise be produced by combining equal amounts of colored light emitted from the primaries 132, 134, 136 may advantageously be replaced by a single high efficacy light 138, such as a white light.

As discussed above, colored light may include light from each primary 132, 134, 136 with varying levels of luminosity. As a result, one primary 136 may require less luminosity that the other primaries 132, 134 to create the desired colored light, defining a minimum color luminosity. Primaries 132, 134 that provide light with greater luminosity than the minimum color luminosity must emit light with at least the minimum color luminosity. Therefore, an equivalent amount of light may be provided by each of the primaries up to the minimum color luminosity may be advantageously emulated by the high efficacy light 138.

Figure 5A:
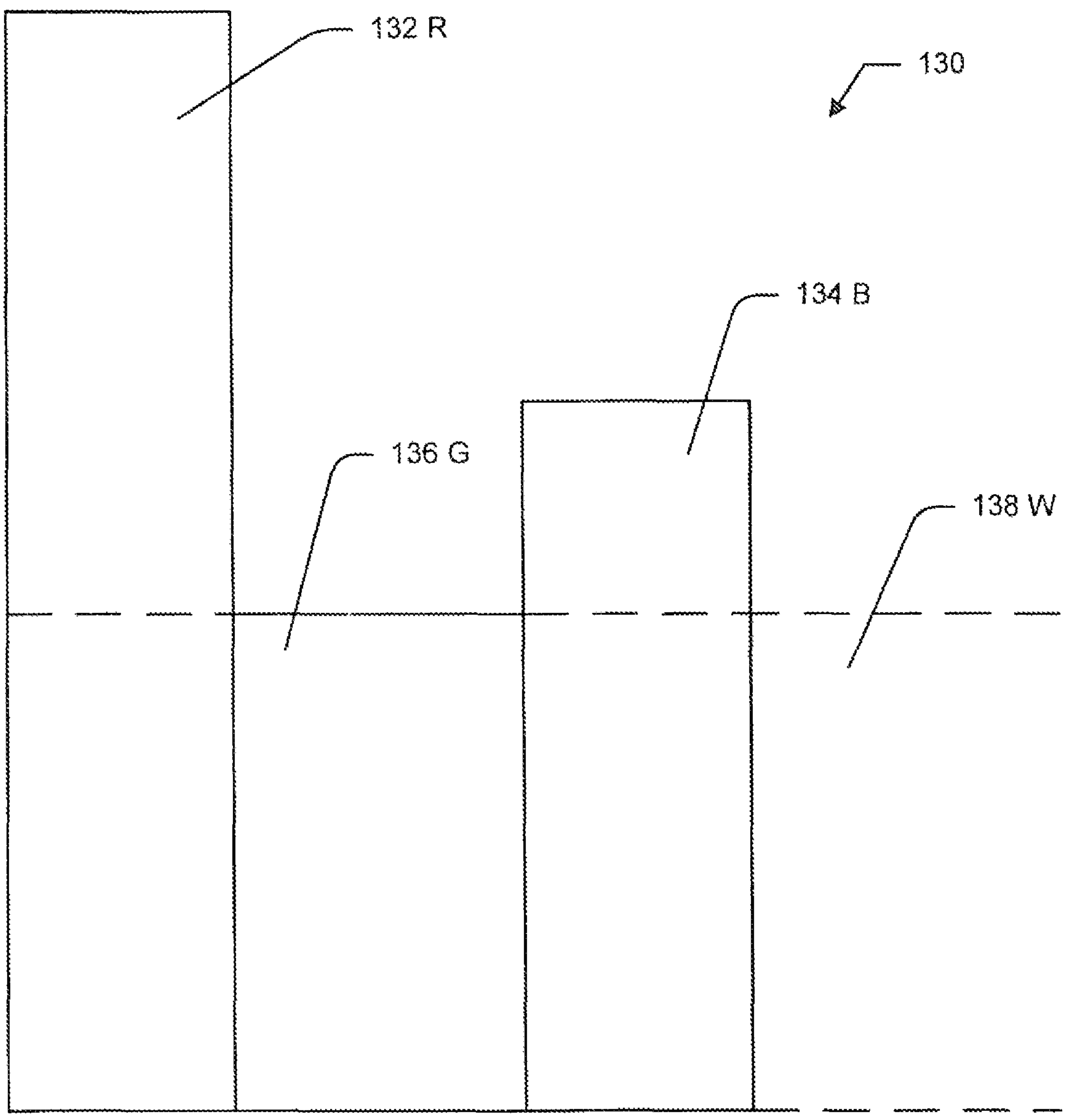
FIG. 5A is a variation of the diagram of FIG. 5.

FIG. 5A illustrates a specific example of the use of a high efficacy light 138W to replace the need for a third primary light 138G will now be discussed. A white light 138W may be created from the light provided by a red primary 132R, a blue primary 134B, and a green primary 136G emitting light of substantially equivalent luminosity. Correspondingly, light that would otherwise be produced by combining equal amounts of colored light emitted from the red primary 132R, the blue primary 134B, and the green primary 136G may advantageously be replaced by a single white light 138W.

As discussed above, red, blue, and green colored light may include light from each primary 132R, 134B, 136G, with varying levels of luminosity. As a result, the green primary 136G may require less luminosity that the red and blue primaries 132R, 134B to create the desired colored light, defining a minimum color luminosity. The red and blue primaries 132R, 134B that provide light with greater luminosity than the minimum color luminosity must emit light with at least the minimum color luminosity. Therefore, an equivalent amount of light may be provided by each of the primaries up to the minimum color luminosity may be advantageously emulated by the high efficacy light 138W.

Referring additionally to FIG. 2, the high efficacy light 138 may be produced by a high efficacy light source 58 included in the lighting device 50. This high efficacy light source 58 may be driven by the output signal 40, which may be produced by the signal converter 10. The light that otherwise would require the emission of an equivalent luminescence by each of the primary light sources 52, 54, 56 may advantageously be substituted by a high efficacy light 138 emitted from the high efficacy light source 58. The remaining light required to create the desired color of light may continue to be emitted by the primary light sources 52, 54, or 56 that may require a luminosity greater than the minimum color luminosity.

The following examples have been provided to help clarify the use of a high efficacy light source 58 to replace the need for a third primary color light source 56. A person of skill in the art will appreciate that the following examples are provided for illustrative purposes, and are not intended to be limiting in any way.

For additional clarity, the follow examples may be described in a first specific non-limiting example, wherein the first primary light source 52 may be assumed to emit a red light and the second primary light source 54 may be assumed to emit a blue light. The following examples may additionally be described in a second specific non-limiting example, wherein the first primary light source 52 may be assumed to emit a green light and the second primary light source 54 may be assumed to emit a red light.

FIGS. 6A-6D illustrate graphs 130A-130D depicting the luminosity provided by the various light sources included in the color space defined in the subset gamut 102. Viewed along with FIG. 2, bars 132A-132D may represent the light emitted by the first primary light source 52. Similarly, bars 134A-134D may represent the light emitted by the second primary light source 54. Finally, bars 138A-138D may represent the light emitted by the high efficacy light source 58. A person of skill in the art will appreciate the first, second, and third color light sources may emit light of any color, as they may be defined for each application. As stated above, the inclusion of the high efficacy light source 58 may negate the need for a third primary light source 56 since the high efficacy light 138 includes light that would otherwise be emitted by the three primary light sources 52, 54, 56.

Figure 6A:
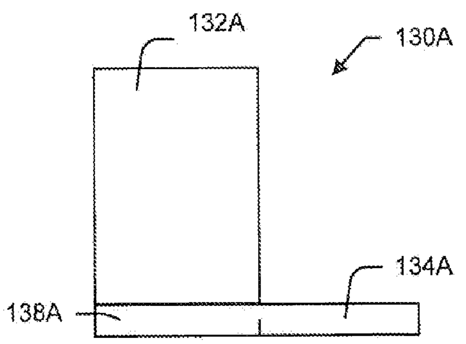
FIGS. 6A through 6D are diagrams illustrating variations of the diagram illustrated in FIG. 5.

More specifically, as illustrated in FIG. 6A, the first example light 130A may be a slightly brightened primary color defined by the output signal 40 of the signal converter 10. Here, the high efficacy light 138A emitted by the high efficacy light source 58 is substantially less luminous than the colored light 132A emitted by the first primary light source 52. Additionally, virtually no colored light 134A may be emitted by the second primary light source 54. In the first specific example, the light defined by the color signal illustrated in FIG. 6A may be a bright red color. In the second specific example, the light defined by the color signal illustrated in FIG. 6A may be a bright green color.

Figure 6B:
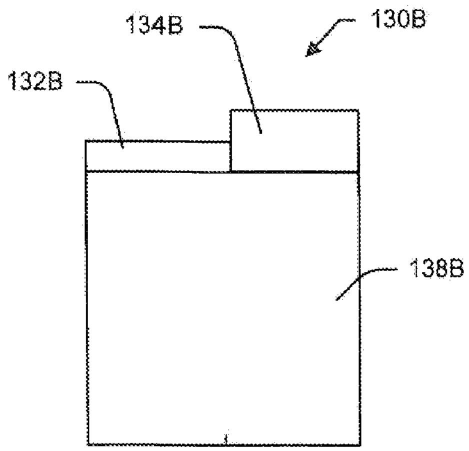

Additionally, as illustrated in FIG. 6B, the second example light 130B may be a slightly tinted white light defined by the output signal 40 of the signal converter 10. Here, the high efficacy light 138B emitted by the high efficacy light source 58 is substantially greater than the colored light 132B, 134B emitted by the first primary light source 52 and second primary light source 54. However, limited amounts of colored light 132B, 134B may be emitted by the first primary light source 52 and the second primary light source 54. In the first specific example, the light defined by the color signal illustrated in FIG. 6B may be a light rose color. In the second specific example, the light defined by the color signal illustrated in FIG. 6B may be a light orange color.

Figure 6C:
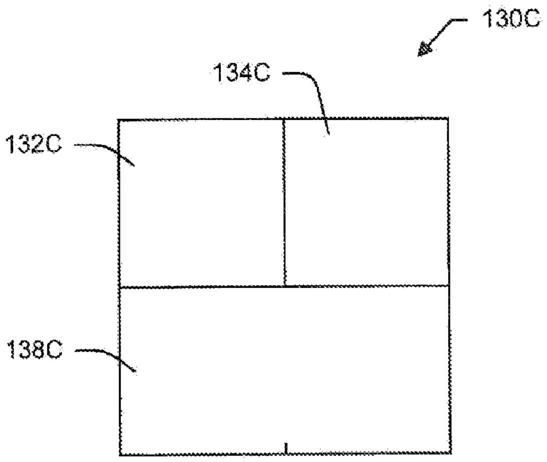

As illustrated in FIG. 6C, the third example light 130C may be a brightened color light defined by the output signal 40 of the signal converter 10. Here, the high efficacy light 138C emitted by the high efficacy light source 58 is relatively equal to the colored light 132C, 134C emitted by the first primary light source 52 and second primary light source 54. Furthermore, the first primary light source 52 and the second primary light source 54 may emit light with approximately equal luminosity. In the first specific example, the light defined by the color signal illustrated in FIG. 6C may be a light magenta color. In the second specific example, the light defined by the color signal illustrated in FIG. 6C may be a light yellow color.

Figure 6D:
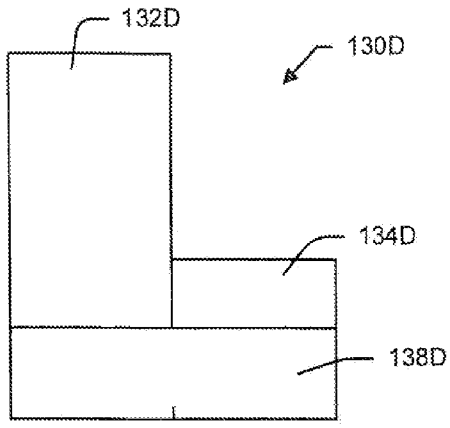

As illustrated in FIG. 6D, the fourth example light 130D may be a slightly brightened color light defined by the output signal 40 of the signal converter 10. Here, the high efficacy light emitted 138D by the high efficacy light source 58 may be relatively similar to the colored light 134D emitted by the second primary light source 54. Additionally, a colored light 132D with increased luminosity may be emitted by the first primary light source 52. In the first specific example, the light defined by the color signal illustrated in FIG. 6D may be a red-violet color. In the second specific example, the light defined by the color signal illustrated in FIG. 6D may be a yellow-green color.

As illustrated by the examples above, virtually any color that may be produced by a lighting device 50 that replaces a third primary light source 56 with a high efficacy light source 58. Such a lighting device 50 may be advantageously driven by the output signal 40 generated by the signal creator during the conversion operation.

The signal converter 10 may perform a computerized conversion operation to accept a source signal 20, which may include a color in a color space defined within the full color gamut 100, analyze the source signal 20, and generate an output signal 40 in a color space defined within a subset gamut 102. The signal conversion operation may be performed by a component of the signal converter 10, such as a signal conversion engine 30. The signal conversion engine 30, and generally the signal conversion operation, may be performed on a computerized device such as the controller 60.

Figure 7:
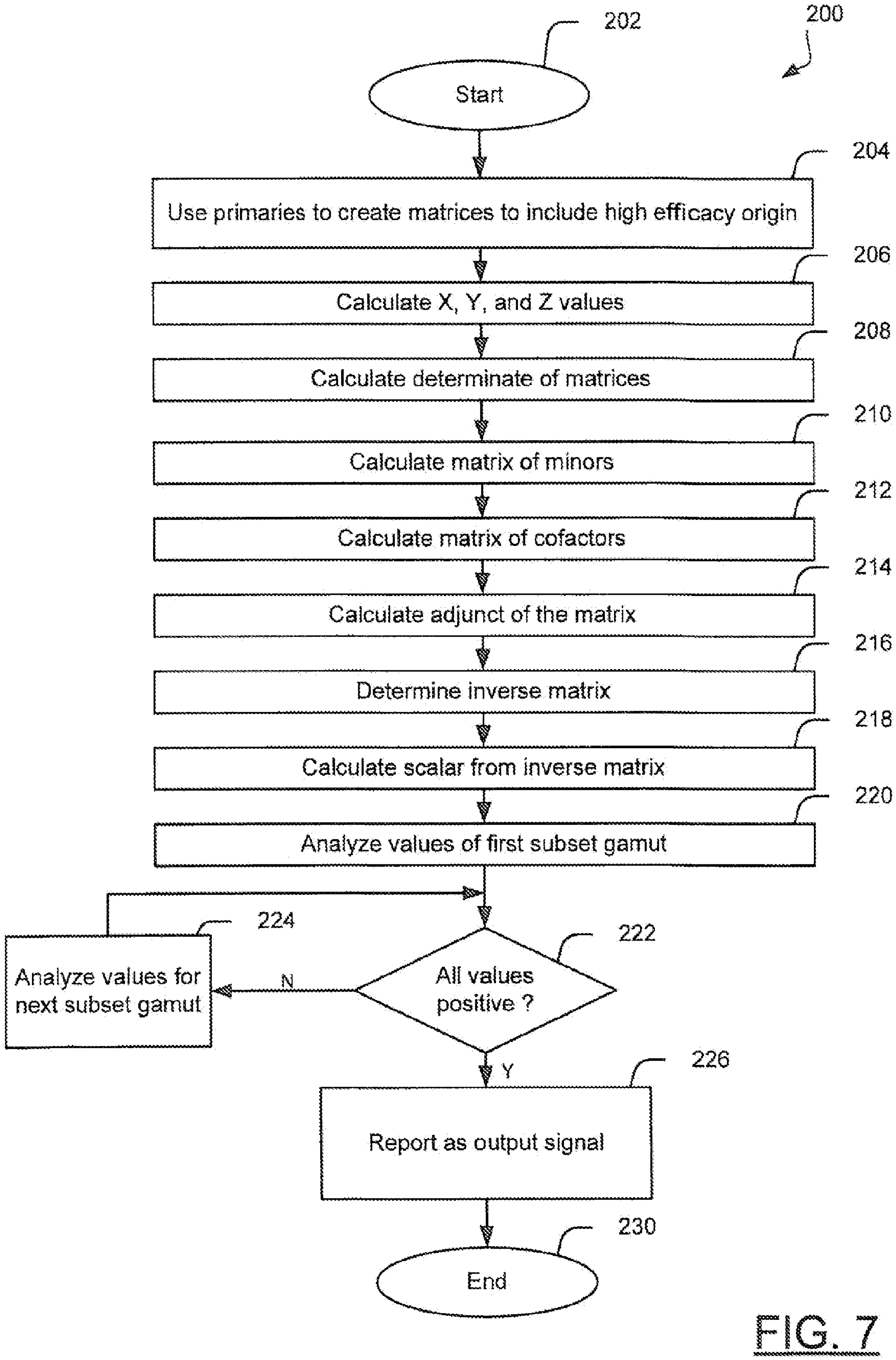
FIG. 7 is a flow chart illustrating a matrix conversion operation according to an embodiment of the present invention.

In an embodiment of the present invention, as perhaps best illustrated by the flowchart 200 of FIG. 7, the conversion operation may be performed via a matrix conversion operation. For clarity, equations are included below to accompany the conversion operation as described in flowchart 200. A person of skill in the art will appreciate that the included equations are provided as an example of an embodiment of performing the steps illustrated in flowchart 200, and should not be considered as limiting. Correspondingly, a skilled artisan will not read the following disclosure as being restricted to the equations illustrated below and appreciate additional equations and algorithms that may be used to operate the present invention.

Included as a non-limiting example, a signal conversion engine 30 of the signal converter 10 may perform the conversion operation mentioned above by calculating the equations that are expressed below. A person of skill in the art will appreciate additional equations and algorithms that may be used to perform the steps of the matrix conversion operation described herein that would be considered within the scope and spirit of the present invention.

Starting at Block 202, using the fundamental rules of colorimetry, the matrix conversion operation may begin by using the primaries 112 to create matrices to include the high efficacy origin (Block 204), as shown below in Expression 1.

Expression 1

$$[M]=\begin{matrix} RX & GX & BX \\ RY & GY & BY \\ RZ & GZ & BZ \end{matrix}$$

The signal conversion operation may then calculate the X, Y, and Z values from the source signal 20 formatted as a xyY color space (Block 206), as shown below in Expression 2.

Expression 2

$$X=\frac{x*Y}{y}$$

$$Y=Y$$

$$Z=\frac{(1-x-y)*Y}{y}$$

The conversion operation may next calculate the determinate of the matrices (Block 208), as shown in Expression 3.

Expression 3

$$RX\begin{vmatrix} GY & BY \\ GZ & BZ \end{vmatrix} - \begin{vmatrix} RY & BY \\ RZ & BZ \end{vmatrix}GX + \begin{vmatrix} RY & GY \\ RZ & GZ \end{vmatrix}BX$$

$$RX\begin{matrix} GY & BY \\ GZ & BZ \end{matrix} - GX\begin{matrix} RY & BY \\ RZ & BZ \end{matrix} + BX\begin{matrix} RY & GY \\ RZ & GZ \end{matrix}$$

Where, $$[M]=\begin{matrix} A1 & B1 \\ A2 & B2 \end{matrix}$$

|M| = (A1 * B2 - A2 * B1)

|M| = RX (GY * BZ - BY * GZ) - GX (RY * BZ - RZ * BY) + BX (RY * GZ - RZ * GY)

The determinate may be used to calculate the matrix of minors (Block 210), as shown in Expression 4.

Expression 4

$$[M]=\begin{matrix} RX & GX & BX \\ RY & GY & BY \\ RZ & GZ & BZ \end{matrix}$$

$$\begin{matrix} \begin{vmatrix} GY & BY \\ GZ & BZ \end{vmatrix} & \begin{vmatrix} RY & BY \\ RZ & BZ \end{vmatrix} & \begin{vmatrix} RY & GY \\ RZ & GZ \end{vmatrix} \\ \begin{vmatrix} GX & BX \\ GZ & BZ \end{vmatrix} & \begin{vmatrix} RX & BX \\ RZ & BZ \end{vmatrix} & \begin{vmatrix} RX & GX \\ RZ & GZ \end{vmatrix} \\ \begin{vmatrix} GX & BX \\ GY & BY \end{vmatrix} & \begin{vmatrix} RX & BX \\ RY & BY \end{vmatrix} & \begin{vmatrix} RX & GX \\ RY & GY \end{vmatrix} \end{matrix}$$

M(minors) =

| | | |
|---|---|---|
| GY * BZ - BY * GZ | RY * BZ - BY * RZ | RY * GZ - RZ * GY |
| GX * BZ - GZ * BX | RX * BZ - RZ * BX | RX * GZ - RZ * GX |
| GX * BY - GY * BX | RX * BY - RY * BX | RX * GY - RY * GX |

With the matrix of minors, the conversion operation may calculate the matrix of cofactors (Block 212), as shown in Expression 5.

Expression 5

$$C_{ij}=(-1)^{i+j}Mij\left(\text{Where } M=\begin{matrix} M11 & M12 & M13 \\ M21 & M22 & M23 \\ M31 & M32 & M33 \end{matrix}\right)$$

$$M(\text{cofactors})=\begin{matrix} GY*BZ-BY*GZ & -RY*BZ-BY*RZ & RY*GZ-RZ*GY \\ -GX*BZ-GZ*BX & RX*BZ-RZ*BX & -RX*GZ-RZ*GX \\ GX*BY-GY*BX & -RX*BY-RY*BX & RX*GY-RY*GX \end{matrix}$$

The conversion operation may next calculate the adjunct of the matrix (Block 214), as shown in Expression 6.

Expression 6

$$adj(A)_{ij} = C_{ji}$$

$$\begin{matrix} M11 & M12 & M13 \\ M21 & M22 & M23 \\ M31 & M32 & M33 \end{matrix} \Rightarrow \begin{matrix} M11 & M21 & M31 \\ M12 & M22 & M32 \\ M13 & M23 & M33 \end{matrix}$$

$$M(adj) = \begin{matrix} GY*BZ-BY*GZ & -GX*BZ-GZ*BX & GX*BY-GY*BX \\ -RY*BZ-BY*RZ & RX*BZ-RZ*BX & -RX*BY-RY*BX \\ RY*GZ-RZ*GY & -RX*GZ-RZ*GX & RX*GY-RY*GX \end{matrix}$$

The conversion operation may then determine the inverse matrix from the adjunct of the matrix (Block 216), as shown in Expression 7.

Expression 7

$$M^{-1} = \frac{adj(M)}{|M|}$$

$$M^{-1} = \frac{\begin{matrix} GY*BZ-BY*GZ & -GX*BZ-GZ*BX & GX*BY-GY*BX \\ -RY*BZ-BY*RZ & RX*BZ-RZ*BX & -RX*BY-RY*BX \\ RY*GZ-RZ*GY & -RX*GZ-RZ*GX & RX*GY-RY*GX \end{matrix}}{RX(GY*BZ-BY*GZ)-GX(RY*BZ-RZ*BY)+BX(RY*GZ-RZ*GY)}$$

The conversion operation may next calculate a scalar from the inverse matrix, which may include scalar values (Block 218). The conversion operation may analyze the values of the scalar as it may describe each color space defined within a subset gamut 102. This comparison may start with the color space defined by a first subset gamut (Block 220).

The signal converter 10 then may determine whether the scalar returned by the conversion operation includes all positive scalar values (Block 222). If the scalar value for the color space defined by a subset gamut 102 includes a negative number, the scalar may not be included within that subset gamut. The signal converter 10 may then analyze the scalar in the next subset gamut 102 (Block 224), after which it may return to the operation described in Block 222.

Conversely, if the scalar includes all positive scalar values at Block 222, the signal converter 10 may determine that the scalar value is included in the color space defined by the correct subset gamut 102. The signal converter 10 may then output the output signal 40 relative to the color space defined by the proper subset gamut 102 (Block 226). After outputting the output signal 40, the matrix conversion operation may end (Block 230).

Referring back to FIG. 4, for illustrative purposes, the color space defined within the full color gamut 100 may be represented as an equilateral triangle. The primaries 112 may be located at the points of the equilateral triangle, representing the primary colors that may be combined to create additional colors within the full color gamut 100. An origin 120 may be located at the midpoint of the equilateral triangle, representing the combination of all primaries 112, which may create white light. This combination has been discussed in greater detail above.

The color space defined within a subset gamut 102 may include a limited number of colors that are otherwise included in the full color gamut 100. However, the colors defined within the full color gamut 100 may be represented via the combination of the various subset gamuts 102. Correspondingly, a color space included within a subset gamut 102 will also be included as part of color space defined within the full color gamut 100.

In an example of the present invention, as illustrated in FIG. 4, the color space defined within the full color gamut 100 may be divided into three approximately equal subset gamuts 102. The combination of these three subset gamuts may comprise the full color gamut 100. More specifically, provided as a non-limiting example, the subset gamuts 102 may define approximately equal color spaces that are included within two primaries 112 and an origin 120.

Figure 8:
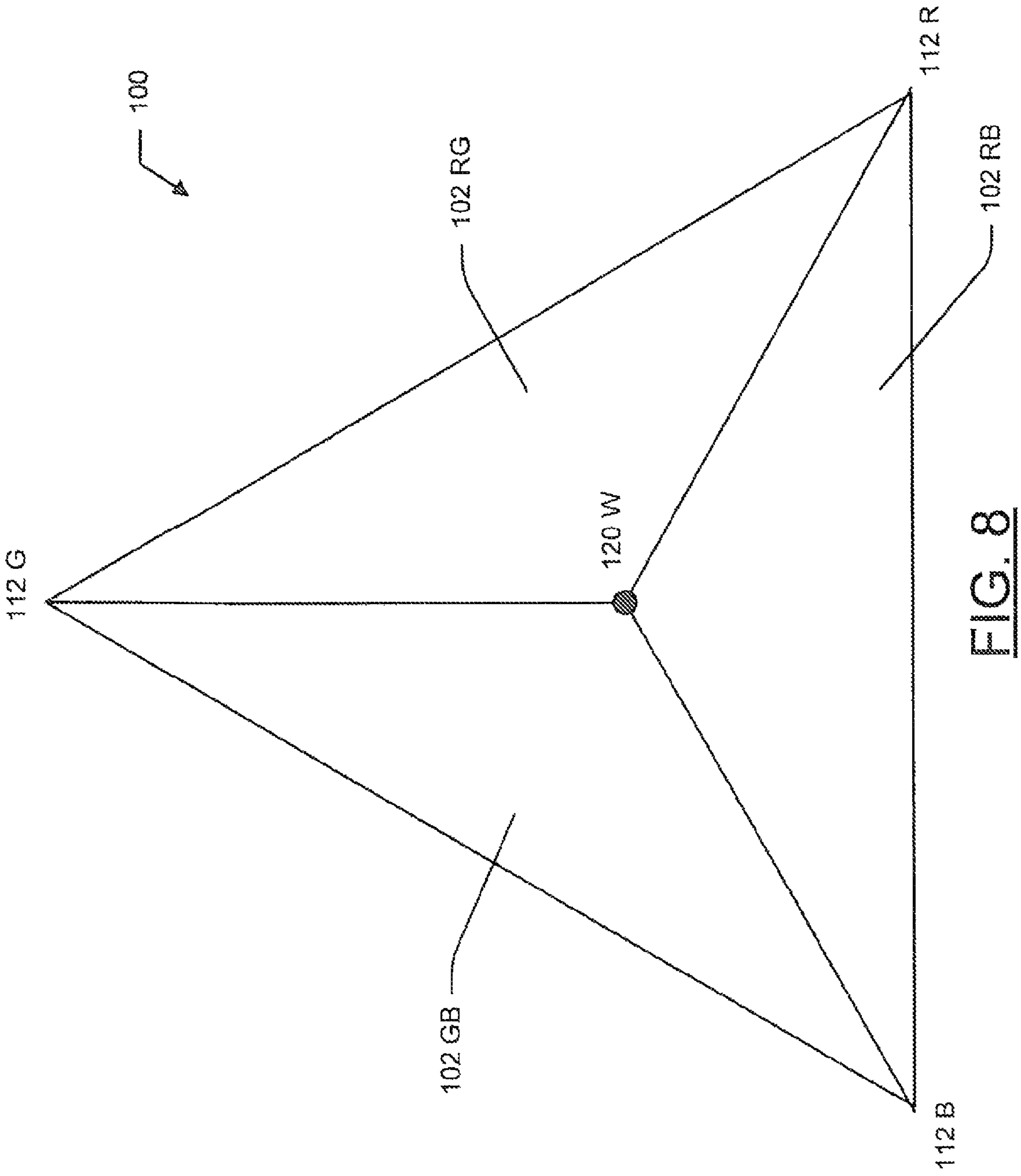
FIG. 8 is a diagram illustrating a variation of the diagram illustrated in FIG. 4.

With reference to FIG. 8, a specific example will now be provided for clarity, and should be appreciated as non-limiting by a person of skill in the art. The full color gamut 100 may be defined to include a red primary 112R, a blue primary 112B, and a green primary 112G. All colors included within the color space defined within the full color gamut 100 may be formed via a combination of the primaries 112R, 112B, 112G. A white origin 120W may be further included at the origin 120 to emit white light in addition to the colored light emitted by the primaries 112R, 112B, 112G.

In this specific example, the color spaces defined within the subset gamuts 102 may include two primaries 112 and the origin 120. A first subset gamut 102RB may be defined to include a red primary 112R, a blue primary 112B, and the white origin 120W. Similarly, a second subset gamut 102RG may be defined to include a red primary 112R, a green primary 112G, and the white origin 120W. A third subset gamut 102GB may be defined to include a green primary 112G, a blue primary 112B, and the white origin 120. In this example, a color that may exist in the color space defined within the full color gamut 100 may also exist in at least one of the color spaces defined within a subset gamut 102.

Figure 9:
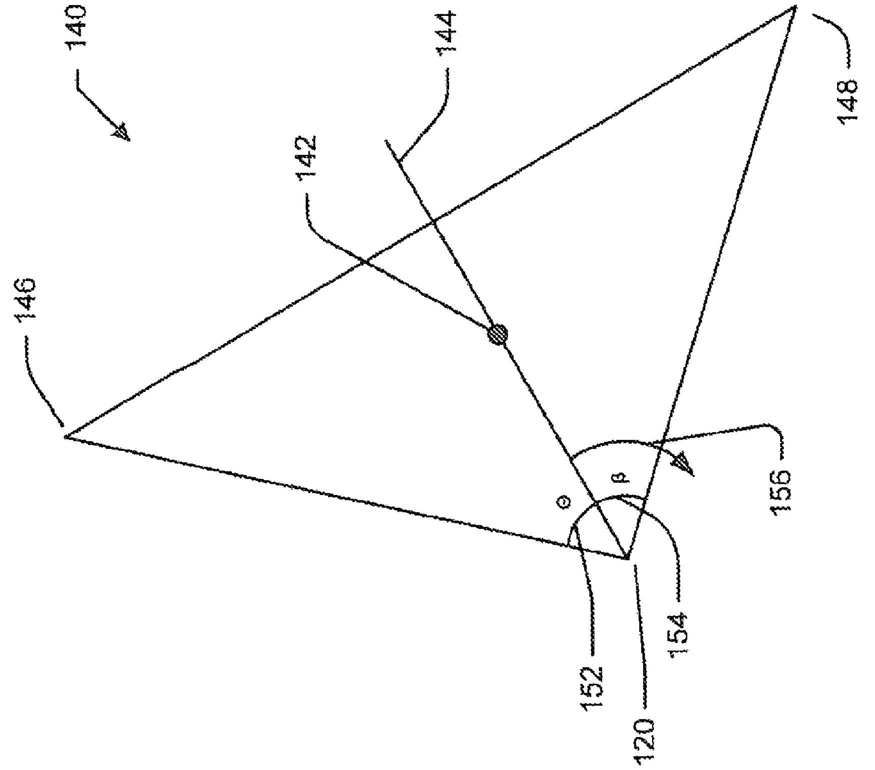
FIG. 9 is a diagram illustrating an angular conversion operation according to an embodiment of the present invention.

An embodiment of the conversion operation using an angular conversion operation, as perhaps best illustrated in FIG. 9, will now be discussed. The signal converter 10 may perform the angular conversion operation by plotting the color of the light defined by the source signal 20 defined by a two spatial plus luminance dimensional color space as a color point 142 onto a three dimensional color space defined within the full color gamut 100. The two spatial plus luminance dimensional color space may be the xyY color space. The three dimensional color space defined within the full color gamut 100 may be the RGBW color space.

The signal converter 10 may then determine a color angle 156 within the three dimensional color space defined by the subset gamut 102 relative to the color of the light defined by the source signal 20. The color space defined within the subset gamut 102 may be radially enclosed between a first primary angle 152 and a second primary angle 154. The first primary angle 152 may be defined as the angle of a line that may extend from the origin 102 to the first primary 148 of the subset gamut 102. The second primary angle 154 may be defined as the angle of the line that may extend from the origin 120 to the second primary 148 of the subset gamut 102.

A color angle 156 may be defined relative to the location of the color of the light 142, as it has been plotted within the subset gamut 102 from the source signal 20, as shown by Expression 8.

$$\left(\theta = \tan^{-1}\left(\frac{y}{x}\right)\right) \quad \text{Expression 8}$$

A first primary angular range may be defined to enclose the angular range between the first primary angle 152 and the color angle 156. The first angular range is illustrated on FIG. 9 as Θ. Similarly, a second primary angular range may be defined to enclose the angular range between the second primary 154 and the color angle 156. The second angular range is illustrated on FIG. 9 as β.

The signal converter 10 may then compare the first primary angular range Θ and the second primary angular range β to determine the relative luminosity emitted by each primary. By dividing the first primary range Θ by the sum of the first and second primary angular ranges Θ, β, the signal converter 10 may determine a first primary angular ratio. Similarly, by dividing the second primary angular range β by the sum of the first and second primary angular ranges Θ, β, the signal converter 10 may determine a second primary angular ratio. An example of these calculations, wherein the first primary light source 52 emits a red light, and wherein the second primary light source emits a green light 54, are shown by Expression 9.

$$\%G = \frac{\beta}{\Theta + \beta} \quad \%R = \frac{\Theta}{\Theta + \beta} \quad \text{Expression 9}$$

The luminosity of the high efficacy light 138 may be calculated from the relative luminosity of the light emitted first and second primaries 146, 148. Alternately, the luminosity of the high efficacy light 138 may be determined by the "Y" value of a xyY source signal 20, as will be appreciated by a person of skill in the art.

Figure 10:
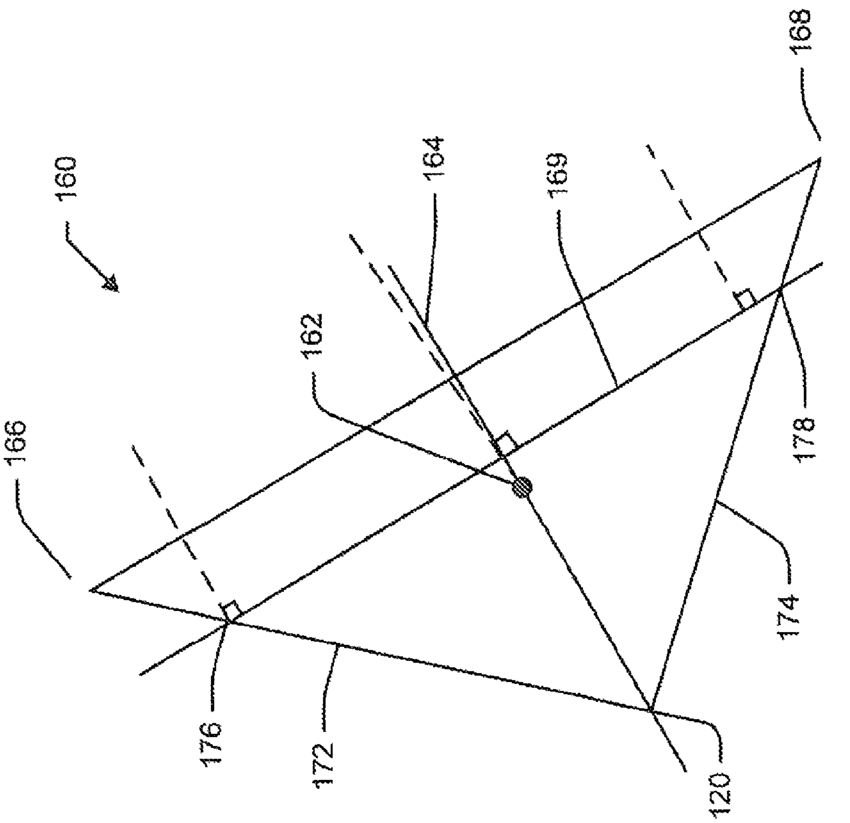
FIG. 10 is a diagram illustrating a linear conversion operation according to an embodiment of the present invention.

An embodiment of the conversion operation using a linear conversion operation, as perhaps best illustrated in FIG. 10, will now be discussed. The signal converter 10 may perform the linear conversion operation by plotting the color of the light included within the source signal 20 defined by a two spatial plus luminance dimensional color space onto a three dimensional color space defined within the full color gamut 100. The two spatial plus luminance dimensional color space may be the xyY color space. The three dimensional color space defined within the full color gamut 100 may be the RGBW color space.

The signal converter 10 may then determine a color point 162 within the three dimensional color space defined by the subset gamut 102 relative to the color of the light defined by the source signal 20. The color space defined within the subset gamut 102 may be enclosed between a first primary line 172 and a second primary line 174. The first primary line 172 may be defined as a line that may extend from the origin 120 to the first primary 166 of the subset gamut 102. The second primary 174 line may be defined as a line that may extend from the origin 102 to the second primary 168 of the subset gamut 102.

A color line 164 may be defined using the slope equation, as shown by Expression 10. In this expression, "y" and "x" may be defined by values included in a xyY source signal 20. The "m" value may define the slope of the color line 164. The "b" value may define the intercept of the y-axis relative to the plotting of the color point 162 within a coordinate system. An example coordinate system may include the equilateral triangle representing the color space defined by full color gamut 100.

$$y=mx+b \quad \text{Expression 10}$$

The slope may be further defined by the equation shown in Expression 11.

$$m = \frac{y_2 - y_1}{x_2 - x_1} \quad \text{Expression 11}$$

The point at which the color line 164 may intercept the y-axis, represented by "b," may be defined to be located at the origin 120. This location of the y-intercept as the origin 120 results in all "b" values becoming zero, simplifying the equation sown in Expression 10 into the equation shown in Expression 12.

$$\therefore y=mx \quad \text{Expression 12}$$

Additionally, a subset gamut 169 line may be defined to intersect the color point 162, the first primary line 172, and the second primary line 174. More specifically, the subset gamut line 169 may intersect the first primary line 172 at a first distance 176 from the origin 120. Similarly, the subset gamut 169 line may intersect the second primary line 174 at a second distance 178 from the origin 120. Preferably, the first distance 176 and the second distance 178 are approximately equal. As a result, the subset gamut line 169 may intersect the first and second primary lines 166, 168 at approximately the same distance from the origin 120, additionally intersecting the color point 162.

The linear signal conversion operation may analyze the subset gamut line 169, as it has been defined above, to determine the boundaries of each color space. In performing the linear signal conversion operation, the signal converter 10 of the present invention may additionally determine the length of each line as it may relate to the origin by calculating a hypotenuse, as shown in Expression 13.

$$h=\sqrt{x^2+y^2} \quad \text{Expression 13}$$

The signal converter 10 may next determine the location of the color point 162 in relation to the first and second primary lines 172, 174, via performance of the above steps for the linear signal conversion operation.

A first primary linear range may be defined along the subset gamut line 169 between the first primary line 172 and the color line 164. The first linear range is illustrated on FIG. 10 as $L_{\Theta}$. Similarly, a second primary linear range may be defined along the subset gamut line 169 between the second primary line 174 and the color line 164. The second primary linear range is illustrated on FIG. 10 as $L_\beta$.

The signal converter 10 may then compare the first primary linear range $L_\Theta$ and the second primary linear range $L_\beta$ to determine the relative luminosity emitted by each primary. By dividing the first primary linear range $L_\Theta$ by the sum of the first and second primary linear ranges, $L_\Theta$, $L_\beta$, the signal converter 10 may determine a first primary linear ratio. Similarly, by dividing the second primary linear range $L_\beta$ by the sum of the first and second primary linear ranges, $L_\Theta$, $L_\beta$, the signal converter 10 may determine a second primary linear ratio. An example of these calculations, wherein the first primary light emits a red light, and wherein the second primary light emits a green light, are shown by Expression 14.

$$\%G = \frac{L_\Theta}{L_\Theta + L_\beta} \quad \%R = \frac{L_\beta}{L_\Theta + L_\beta} \qquad \text{Expression 14}$$

The luminosity of the high efficacy light 138 may be calculated from the relative luminosity of the light emitted as defined by the first and second primaries 166, 168. Alternately, the luminosity of the high efficacy light 138 may be determined by the "Y" value of the xyY input signal, as will be appreciated by a person of skill in the art.

Figure 11:
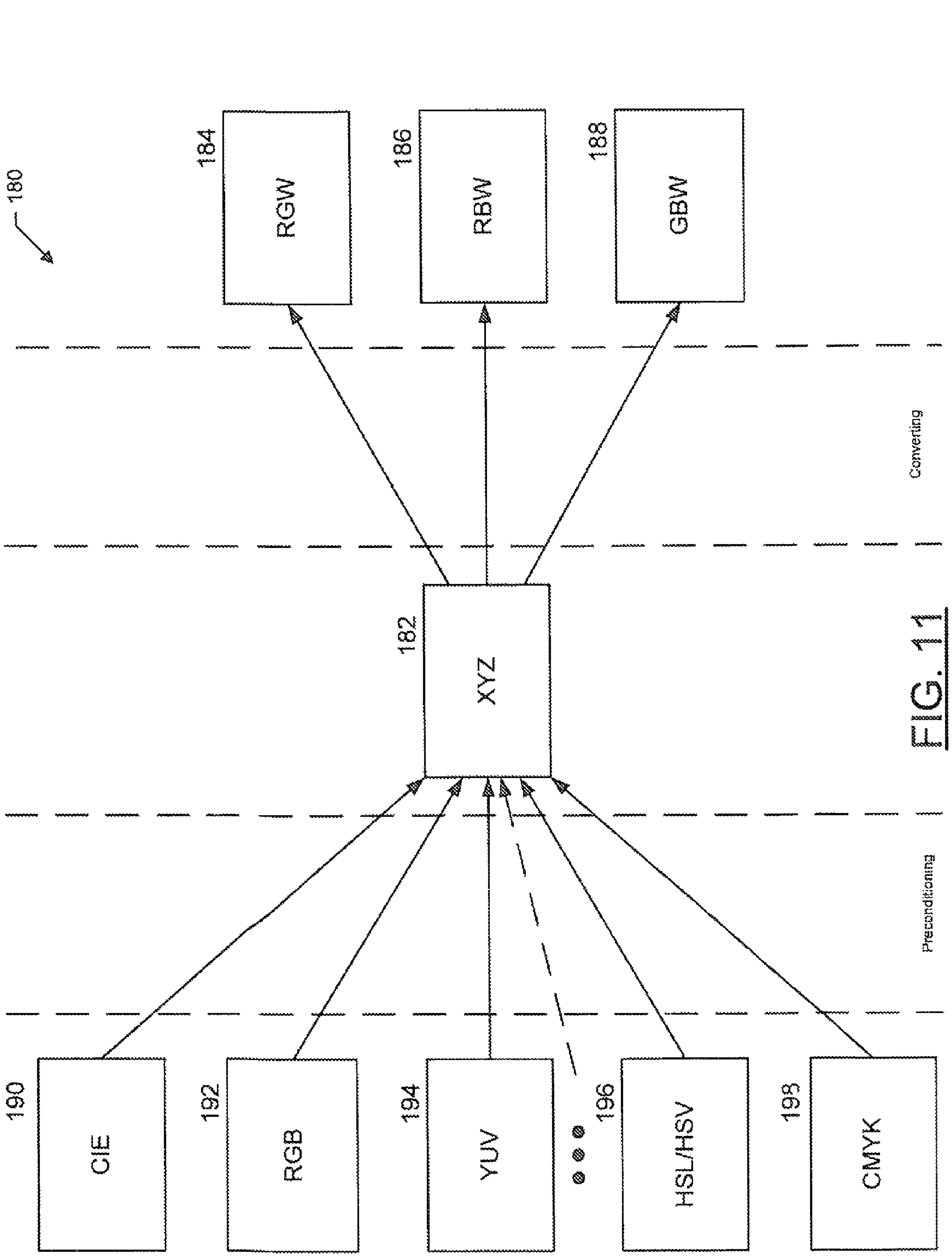
FIG. 11 is a flow chart illustrating the input signals defined in one color space that may be preconditioned into a source signal prior to performing the conversion operation, according to an embodiment of the present invention.

In an embodiment of the present invention, as perhaps best illustrated by the block diagram in FIG. 11, the signal converter 10 may accept an input signal that defines a color within a color space other than a two spatial plus luminance dimensional color space, such as an xyY color space 182. Non-limiting examples of these alternate input signals may include color spaces defined within the major models of CIE color space 190, RGB color space 192, YUV color space 194, color space HSL/HSV 196, and CMYK color space 198. The input signal received in alternate color spaces may be preconditioned into a source signal 20 defined within a two spatial plus luminance dimensional color space prior to initiating the conversion operation, such as the xyY color space 182.

As a specific example, provided without limitation, an input signal may be defined within the RGBW, which may be included within the RGB color space 192. For clarity, the preconditioning of the input signal that includes a color defined within the RGBW color space will be described in this example using the matrices to precondition the input signal into a desired source signal 20. A person of skill in the art will appreciate that additional operation that may be used to precondition an input signal that includes a color defined in various other color spaces into the source signal 20 to be used by the signal converter 10 to perform the conversion operation.

In this example, the RGBW input signal may be represented as non-square matrices. The preconditioning of the RGBW input signal may begin by finding the pseudo-inverse of the non-square matrices that represent the input signal, as shown in Expression 15.

$$\begin{matrix} X \\ Y \\ Z \end{matrix} = \begin{matrix} RX & GX & BX & WX \\ RY & GY & BY & WY \\ RZ & GZ & BZ & WZ \end{matrix} * \begin{matrix} R \\ G \\ B \end{matrix} \qquad \text{Expression 15}$$

$$\begin{matrix} R \\ G \\ B \end{matrix} = \begin{matrix} RX & GX & BX & WX \\ RY & GY & BY & WY \\ RZ & GZ & BZ & WZ \end{matrix}^{-1} * \begin{matrix} X \\ Y \\ Z \end{matrix}$$

The preconditioning operation may be performed by reducing the non-square matrix into a bidiagonal matrix. The preconditioning operation may then compute the singular value decomposition (SVD), as it is defined in the Fundamental Theorem of Linear Algebra. Using SVD, the preconditioning operation may decompose the non-square matrices into three matrices, as shown in Expression 16.

$$[A]=[U][\Sigma][V]^{-1} \qquad \text{Expression 16}$$

In the preceding expression, [A] may represent the non-square matrix, [U] may represent an orthogonal 3×3 matrix, and [Σ] may represent a non-square 4×3 matrix. Additionally, the [Σ] value may be a diagonal matrix, and therefore may only include zeros off of the diagonal values, as will be understood by a person of skill in the art. The diagonal values may be eigenvalues of [A] (where $\sigma_1 \geq \sigma_2 \geq \sigma_3 \geq \ldots \geq \sigma_n$).

For [U] and [V], eigenvectors may comprise column value, as they may be defined in the matrices. A computation known within the art may then be performed to precondition the input signal into a inverted matrix. This inverted matrix may provide the preconditioned source signal 20 that may be converted into the output signal 40.

In an additional embodiment, the signal converter 10 of the present invention may include a photodiode to determine the color of light being emitted by LEDs. The LEDs may be driven by the output signal 40 generated by the signal converter 10 via a conversion operation. Upon sensing the color of emitted light, the photodiode may transmit a color feedback signal to the signal converter 10 of the present invention. The signal converter 10 may then adjust the luminosity emitted by one or more of the primary light sources 52, 54, 56 and/or the high efficacy light source 58. The adjustments may be made to correct for discrepancies between the intended color defined by the output signal 40 and the actual color being emitted by a lighting device 50, driven by the output signal 40.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

What is claimed is:

1. A signal adapting chromaticity system to control a lighting device comprising:

a signal conversion engine that receives a source signal designating a color of light defined by a two spatial plus luminance dimensional color space and converts the source signal to a three dimensional color space defined within a subset gamut of a full color gamut;

wherein the signal conversion engine performs a conversion operation to convert the source signal to an output signal, and uses the output signal to drive light emitting diodes (LEDs); and wherein the subset gamut includes a first color light, a second color light and a high efficacy light; and wherein the high efficacy light is defined by a color temperature between 2000K and 100000K;

wherein the conversion operation converts the source signal to the output signal by performing a matrix conversion operation;

wherein matrices are defined for the two spatial plus luminance dimensional color space included in the source signal;

wherein the matrices are inverted to define inverse matrices that are processed to define a scalar including scalar values that are positive and included in the output signal; and wherein the output signal defines the color of the light in the three dimensional color space defined within the subset gamut.

2. A system according to claim 1 wherein the first color light and the second color light are emitted by colored LEDs, and wherein the high efficacy light is emitted by a high efficacy LED.

3. A system according to claim 2 further including a conversion coating applied to the colored LEDs to convert a source light wavelength range into a converted light wavelength range.

4. A system according to claim 1 wherein the two spatial plus luminance dimensional color space is a xyY color space, the three dimensional color space defined within the full color gamut is a RGBW color space, and the three dimensional color space defined within the subset gamut is selected from a group comprising a RGW color space, GBW color space, or RBW color space.

5. A system according to claim 1 wherein the first color light and the second color light are selected from a group comprising a red light, a blue light, and a green light, and wherein the high efficacy light is a white light.

6. A system according to claim 1 wherein the matrices that are defined as non-square matrices undergo square matrix preconditioning.

7. A system according to claim 1 wherein the conversion operation converts the source signal to the output signal by performing an angular conversion operation.

8. A system according to claim 7 wherein the three dimensional color space defined by the subset gamut is divided from the full color gamut by using angular determination, the subset gamut including an origin that includes the high efficacy light, primaries that include colored light, the primaries defined in the subset gamut including a first subset primary relative to the first color light and a second subset primary relative to the second color light, and a subset gamut angular range included between a first primary angle relative to the first subset primary and a second primary angle relative to the second primary angle.

9. A system according to claim 8 wherein the three dimensional color space included in the subset gamut is triangularly located between the origin, the first subset primary, and the second subset primary;

wherein the color of the light defined by the two spatial plus luminance dimensional color space is plotted in the three dimensional color space of the full color gamut; and wherein a color angle is located within the three dimensional color space defined by the subset gamut relative to the color of the light, the color angle being located between the first primary angle and the second primary angle.

10. A system according to claim 9 wherein a first primary angular range is included between the first primary angle and the color angle, and wherein a second primary angular range is included between the second primary angle and the color angle;

wherein the first primary angular range is compared to the second primary angular range to determine a first primary angular ratio proportional to a first portion of the subset gamut angular range comprised of the first primary angular range, and the first primary angular ratio determining a luminosity of the first subset primary included in the output signal;

wherein the second primary angular range is compared to the first primary angular range to determine a second primary angular ratio proportional to a second portion of the subset gamut angular range comprised of the second primary angular range, and the second primary angular ratio determining the luminosity of the second subset primary included in the output signal; and wherein the luminosity of the first subset primary and second subset primary are analyzed to determine the luminosity of the high efficacy light included in the output signal.

11. A system according to claim 1 wherein the conversion operation converts the source signal to the output signal by performing a linear conversion operation.

12. A system according to claim 11 wherein the three dimensional color space defined by the subset gamut is divided from the full color gamut to include an origin that includes the high efficacy light, primaries that include colored light, the primaries defined in the subset gamuts including a first subset primary relative to the first color light and a second subset primary relative to the second color light, and a color point defined by plotting the color of the light as defined within the two spatial plus luminance dimensional color space in the three dimensional color space of the full color gamut; and wherein lines are defined relative to the two spatial plus luminance dimensional color space.

13. A system according to claim 12 wherein the lines include a first primary line defined between the origin and the first subset primary, a second primary line defined between the origin and the second subset primary, a color line defined between origin and the color point including a slope and an axial intercept, and a subset gamut line that intersects the first primary line, the second primary line, and the color point.

14. A system according to claim 13 wherein the axial intercept is located at the origin;

wherein the subset gamut line interests the first primary line at a first primary intersection distance from the origin, wherein the subset gamut line intersects the second primary line at a second primary intersection distance from the origin, and wherein the first primary intersection distance and the second primary intersection distance are substantially equal;

wherein a subset gamut linear range is defined along the subset gamut line between the first primary line and the second primary line, the subset gamut linear range including a first primary linear range and a second primary linear range;

wherein the first primary linear range is compared to the second primary linear range to determine a first primary linear ratio proportional to a first portion of the subset gamut linear range comprised of the first primary linear range, and the first primary linear ratio determining a luminosity of the first subset primary included in the output signal;

wherein the second primary linear range is compared to the first primary linear range to determine a second primary linear ratio proportional to a second portion of the subset gamut linear range comprised of the second primary linear range, and the second primary linear ratio determining the luminosity of the second subset primary included in the output signal; and wherein the luminosity of the first subset primary and the second subset primary are analyzed to determine the desired luminosity of the high efficacy light included in the output signal.

15. A system according to claim 1 wherein a color feedback signal is received to perform a color correction operation.

16. A method for controlling a lighting device comprising:

receiving a source signal designating a color of light defined by a two spatial plus luminance dimensional color space;

converting the source signal to an output signal defined by a three dimensional color space defined within a subset gamut of a full color gamut by performing a conversion operation, the subset gamut including a first color light, a second color light and a high efficacy light;

using the output signal to drive light emitting diodes (LEDs);

performing a matrix conversion operation to convert the source signal to the output signal wherein performing the matrix conversion operation further includes defining matrices for the two spatial plus luminance dimensional color space included in the source signal;

preconditioning the matrices that are defined as non-square matrices;

inverting the matrices to define inverse matrices;

processing the inverse matrices to define a scalar including scalar values that are positive and included in the output signal; and defining the color of the light in the three dimensional color space defined within the subset gamut in the output signal.

17. A method according to claim 16 wherein the first color light and the second color light are emitted by colored LEDs, and wherein the high efficacy light is emitted by a high efficacy LED.

18. A method according to claim 17 further including converting a source light wavelength range into a converted light wavelength range by applying a conversion coating to the colored LEDs.

19. A method according to claim 16 wherein the two spatial plus luminance dimensional color space is a xyY color space, the three dimensional color space defined within the full color gamut is a RGBW color space, and the three dimensional color space defined within the subset gamut is selected from a group comprising a RGW color space, GBW color space, or RBW color space.

20. A method according to claim 16 further including selecting the first color light and the second color light from a group comprising a red light, a blue light, and a green light, and wherein the high efficacy light is a white light.

21. A method according to claim 16 wherein the high efficacy light is defined by a color temperature between 2000K and 10000K.

22. A method according to claim 16 further including performing an angular conversion operation to convert the source signal to the output signal.

23. A method according to claim 22 wherein performing the angular conversion operation further includes dividing three dimensional color space defined by the full color gamut by using angular determination to include the three dimensional color space defined by the subset gamut by including an origin that includes the high efficacy light, primaries that include colored light, the primaries defined in the subset gamut including a first subset primary relative to the first color light and a second subset primary relative to the second color light, and a subset gamut angular range included between a first primary angle relative to the first subset primary and a second primary angle relative to the second primary angle.

24. A method according to claim 23 wherein performing the angular conversion operation further includes triangularly locating the three dimensional color space included in the subset gamut between the origin, the first subset primary, and the second subset primary;

plotting the color of the light defined by two spatial plus luminance dimensional color space in the three dimensional color space of the full color gamut; and locating a color angle within the three dimensional color space defined by the subset gamut relative to the color of the light, the color angle being located between the first primary angle and the second primary angle.

25. A method according to claim 24 wherein performing the angular conversion operation further includes locating a first primary angular range between the first primary angle and the color angle;

locating a second primary angular range between the second primary angle and the color angle;

comparing the first primary angular range to the second primary angular range to determine a first primary angular ratio proportional to a first portion of the subset gamut angular range comprised of the first primary angular range, and the first primary angular ratio determining a luminosity of the first subset primary included in the output signal;

comparing the second primary angular range to the first primary angular range to determine a second primary angular ratio proportional to a second portion of the subset gamut angular range comprised of the second primary angular range, and the second primary angular ratio determining the luminosity of the second subset primary included in the output signal; and analyzing the luminosity of the first subset primary and second subset primary to determine the luminosity of the high efficacy light included in the output signal.

26. A method according to claim 16 further including performing a linear conversion operation to convert the source signal to the output signal.

27. A method according to claim 26 wherein performing the linear conversion operation further includes dividing the three dimensional color space defined by the full color gamut to include the three dimensional color space defined by the subset gamut by including an origin that includes the high efficacy light, primaries that include colored light, the primaries defined in the subset gamuts including a first subset primary relative to the first color light and a second subset primary relative to the second color light, and a color point defined by plotting the color of the light as defined within the two spatial plus luminance dimensional color space in the three dimensional color space of the full color gamut; and defining lines relative to the two spatial plus luminance dimensional color space.

28. A method according to claim 27 wherein the lines include a first primary line defined between the origin and the first subset primary, a second primary line defined between the origin and the second subset primary, a color line defined between origin and the color point including a slope and an axial intercept, and a subset gamut line that intersects the first primary line, the second primary line, and the color point.

29. A method according to claim 28 wherein performing the linear conversion operation further includes locating the axial intercept at the origin;

wherein the subset gamut line interests the first primary line at a first primary intersection distance from the origin, wherein the subset gamut line intersects the second primary line at a second primary intersection distance from the origin, and wherein the first primary intersection distance and the second primary intersection distance are substantially equal;

defining a subset gamut linear range along the subset gamut line between the first primary line and the second primary line, the subset gamut linear range including a first primary linear range and a second primary linear range;

comparing the first primary linear range to the second primary linear range to determine a first primary linear ratio proportional to a first portion of the subset gamut linear range comprised of the first primary linear range, and the first primary linear ratio determining a luminosity of the first subset primary included in the output signal;

comparing the second primary linear range to the first primary linear range to determine a second primary linear ratio proportional to a second portion of the subset gamut linear range comprised of the second primary linear range, and the second primary linear ratio determining the luminosity of the second subset primary included in the output signal; and analyzing the luminosity of the first subset primary and the second subset primary to determine the desired luminosity of the high efficacy light included in the output signal.

30. A method according to claim 16 further including receiving a color feedback signal and performing a color correction operation.

* * * * *

UNITED STATES PATENT AND TRADEMARK OFFICE

CERTIFICATE OF CORRECTION

PATENT NO. : 8,547,391 B2
APPLICATION NO. : 13/107928
DATED : October 1, 2013
INVENTOR(S) : Fredric S. Maxik et al.

It is certified that error appears in the above-identified patent and that said Letters Patent is hereby corrected as shown below:

In the Claims:

In column 18, line 57, delete "and."

In column 18, line 59, in "high efficacy light; and," delete "and."

In column 18, line 61, delete "100000K" and insert -- 10000K --.

Signed and Sealed this
Third Day of December, 2013

Margaret A. Focarino
*Commissioner for Patents of the United States Patent and Trademark Office*